United States Patent [19]

Uemura

[11] Patent Number: 5,010,230
[45] Date of Patent: Apr. 23, 1991

[54] LASER PROCESSOR

[75] Inventor: Tsunesaburo Uemura, Tokyo, Japan

[73] Assignee: Nikon Corporation, Tokyo, Japan

[21] Appl. No.: 554,840

[22] Filed: Jul. 20, 1990

[30] Foreign Application Priority Data

Jul. 24, 1989 [JP] Japan .................................. 1-190862

[51] Int. Cl.$^5$ ............................................. B23K 26/00
[52] U.S. Cl. ........................... 219/121.62; 219/121.83
[58] Field of Search ...................... 219/121.61, 121.62, 219/121.83

[56] References Cited

U.S. PATENT DOCUMENTS

| 4,087,672 | 5/1978 | Yi ..................................... | 219/121.85 |
| 4,769,523 | 9/1988 | Tanimoto e tal. ......... | 219/121.62 X |
| 4,812,641 | 3/1989 | Ortiz, Jr. ......................... | 219/121.62 |
| 4,866,243 | 9/1989 | Sakane et al. ................... | 219/121.62 |

*Primary Examiner*—C. L. Albritton
*Attorney, Agent, or Firm*—Shapiro and Shapiro

[57] ABSTRACT

A laser processor provided with a pulse oscillating laser light source, an exciter for exciting the laser light source on a trigger signal for pusle oscillation, a beam quality adjusting device for adjusting a beam quality as monitoring the pulse-oscillated laser light partly at least, a working apparatus for exposing or processing a workpiece by projecting the adjusted laser light thereon. The laser light from a laser light source side is intercepted by a shutter while it is not used on a sequence on a working apparatus side, thereby operating the laser light source for self-oscillation at a low frequency of 1 to 2 hz, for example; the laser light source is then operated for self-oscillation at a frequency higher than that with the shutter closed therefor when a quality abnormal signal is generated from an abnormal detector upon detection of a beam quality coming outside a standard.

2 Claims, 11 Drawing Sheets

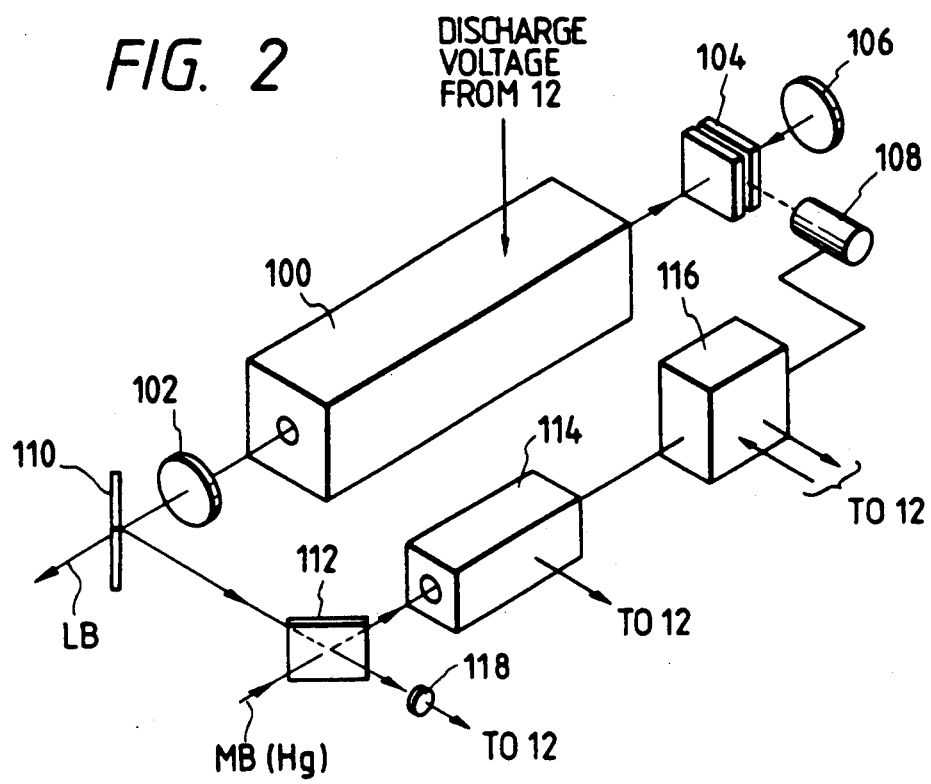
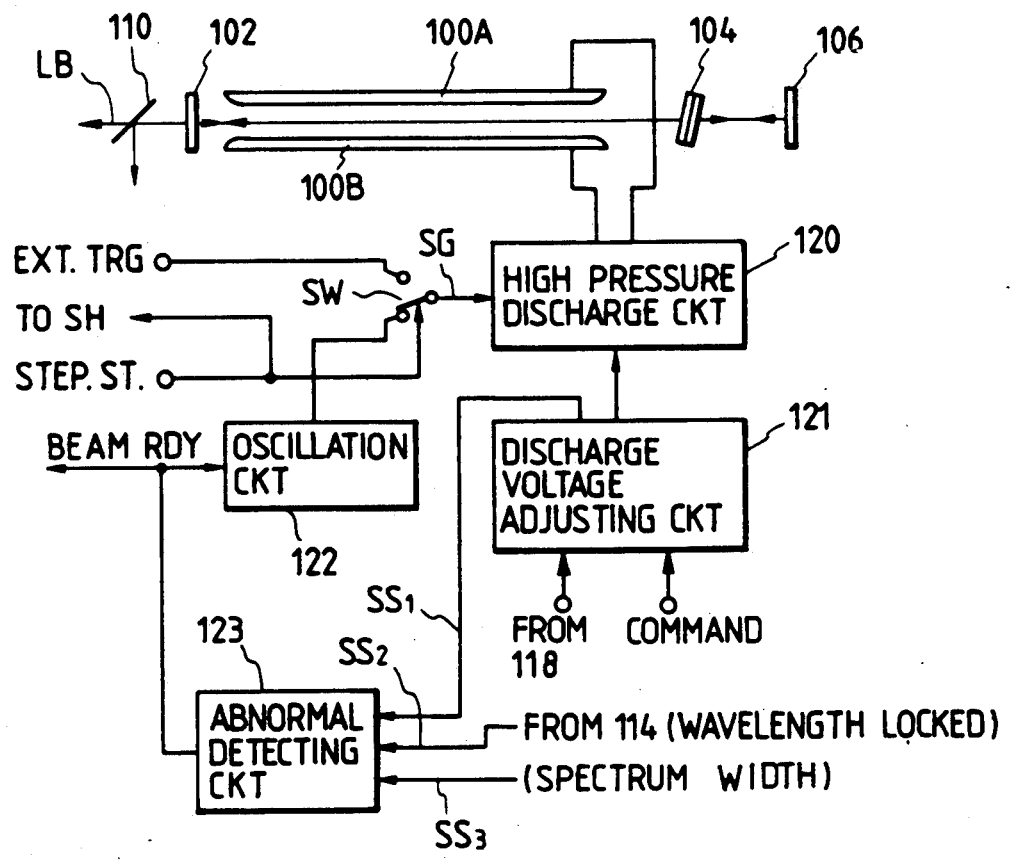

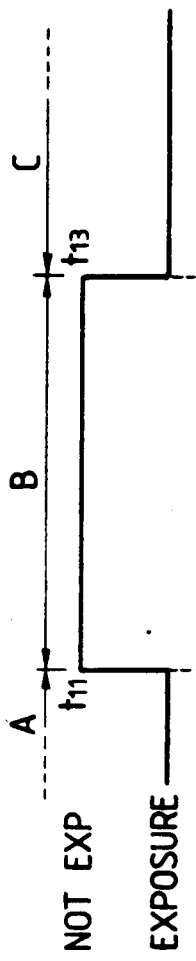
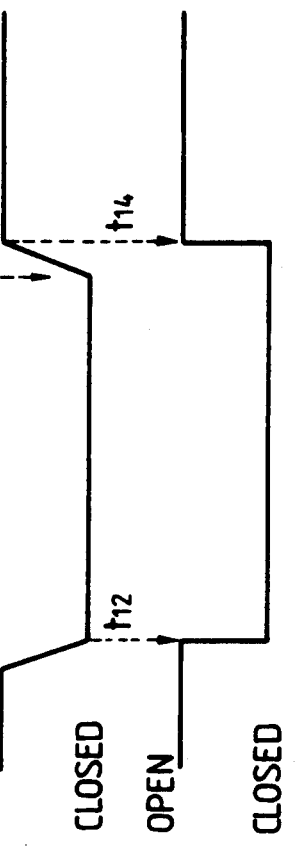

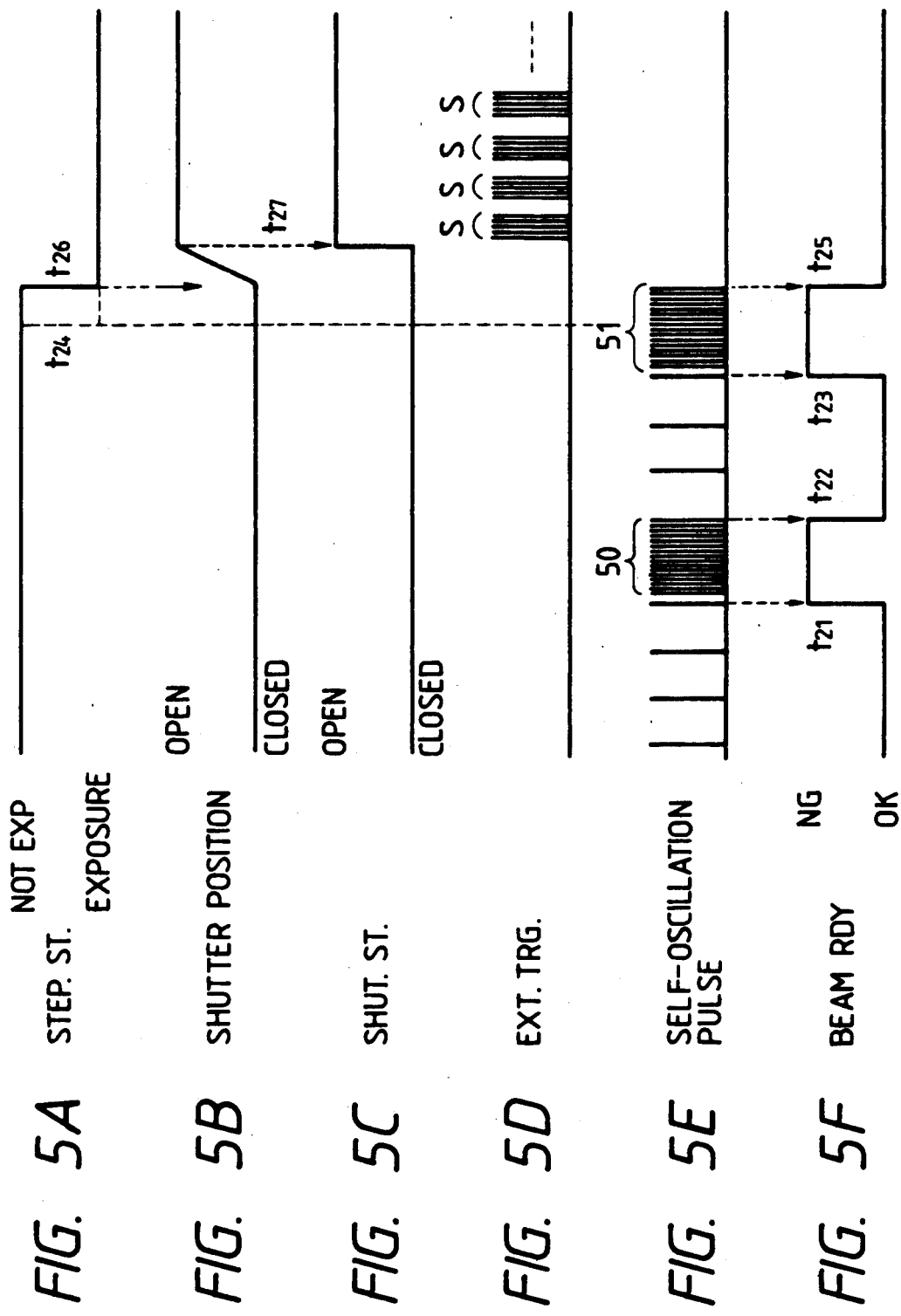

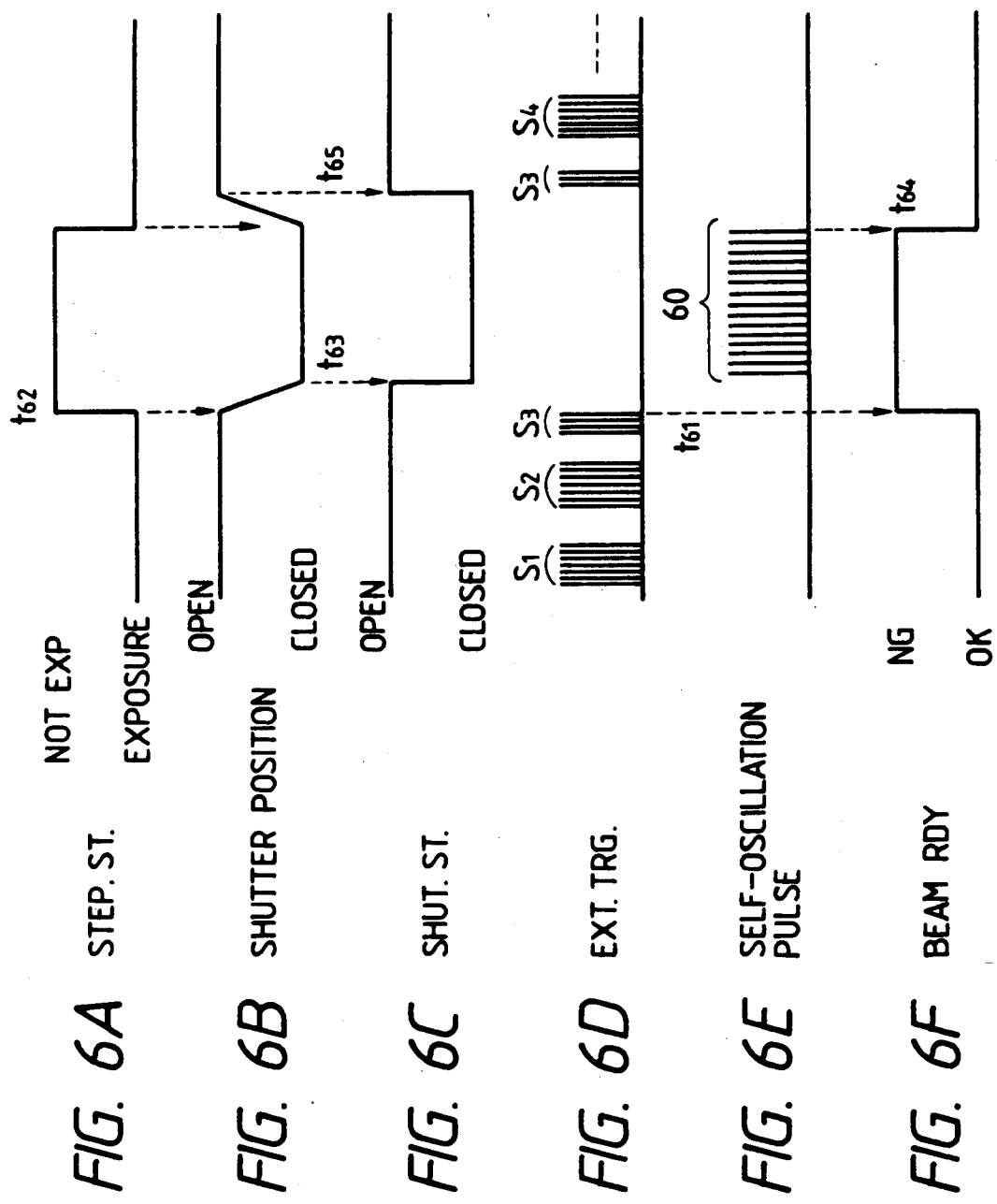

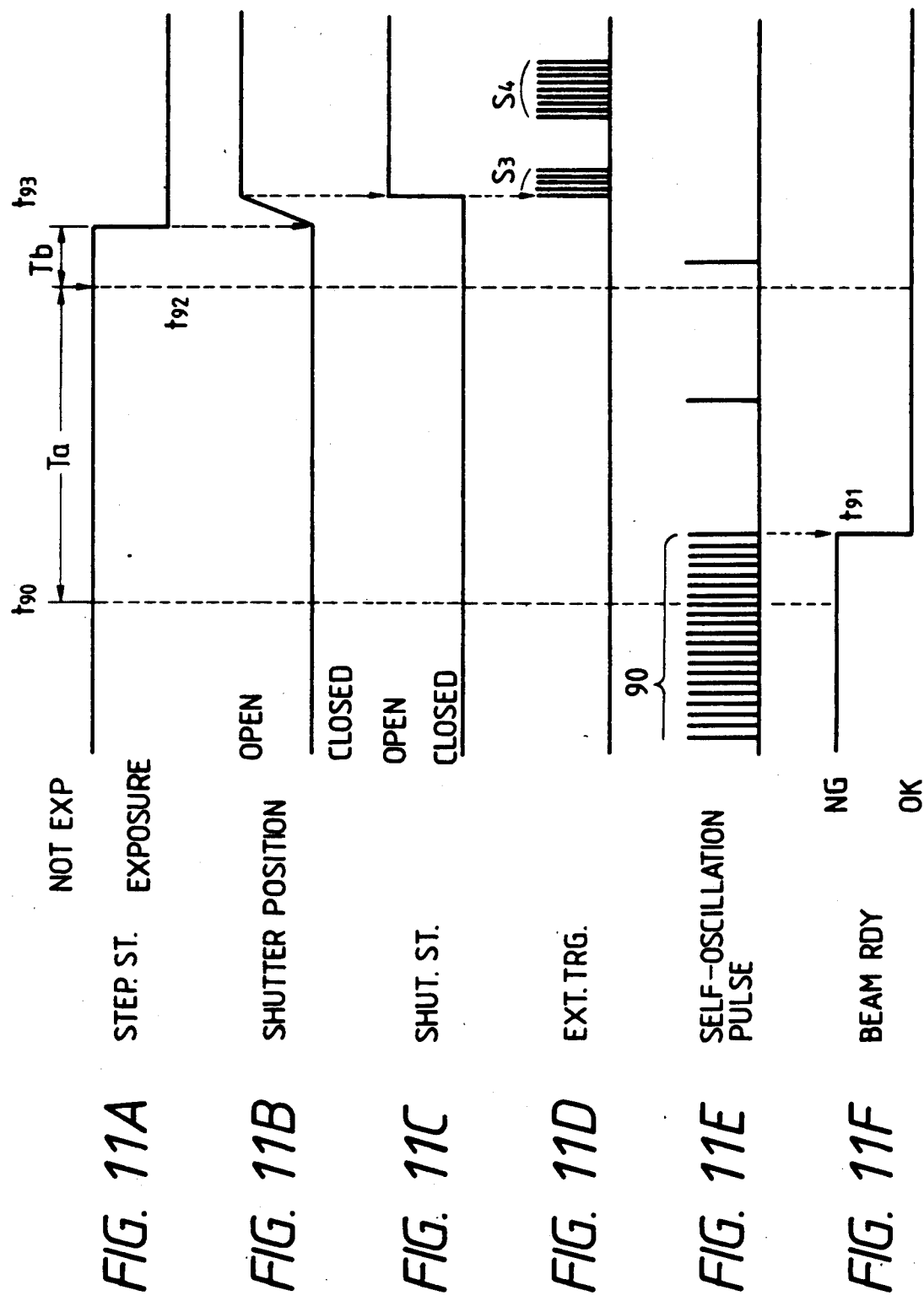

LASER PROCESSOR

BACKGROUND OF THE INVENTION

1. Field of the Invention

This invention relates to a processor such as exposure device provided with a laser light source, repair device for wafer and mask using a laser beam or the like, and is particularly concerned with an exposure processor for printing a pattern formed on a mask onto a photosensitive substrate such as semiconductor wafer or the like through a projection optical system in a lithography process for production of semiconductor integrated circuits.

2. Related Background Art

A reduced projection exposure device in step-and-repeat system, or a so-called stepper functions centrally in a lithography process for the production of semiconductor integrated circuits. The stepper exposes a circuit pattern formed on a mask or reticle (hereinafter called reticle) onto a photosensitive substrate such as semiconductor wafer with a resist applied thereto or the like (hereinafter called wafer) sequentially at local domains through a reduced projection lens (hereinafter simply called projection lens). In recent years an integration of semiconductor integrated circuits has been enhanced more and more, and thus a requirement is such that the circuits will be formed in submicrons for minimum line width. Consequently, as is preferable for the lithography with a line width of submicrons, drawing the attention presently is a stepper using a laser emitted in the ultraviolet zone at high luminance and high output like KrF laser as a light source for exposure.

Meanwhile, a material usable on a projection lens with such ultraviolet zone laser whose wavelength is shorter than 365 nm (i line of Hg lamp) as an illumination light for exposure is limited to synthetic quartz, fluorite and the like. However, since a spectrum width of the laser is 0.3 to 0.4 nm or so in half-amplitude level, a chromatic abberation may result on the projection lens constructed, for example, only of a quartz lens. Consequently, an achromatic lens with glass materials combined in two kinds or more therefor will be used, however, there is a problem unavoidable in shape (size) and grinding characteristic of the crystal material such as fluorite or the like, and thus a design and manufacture of the lens are subjected considerably to limitations. Then, the projection lens may be fabricated of a single material of quartz lens instead of the aforementioned achromatic lens from using a light extremely narrow in a half-amplitude level of the spectrum width (or a light, for example, narrowed to a band 0.01 to 0.005 nm or below) as exposure light, and a difficulty in designing and producing the projection lens will be removed to a great extent.

Now, therefore, in the stepper provided with such laser, it is generally considered that an exposure of high resolution be realized by narrowing the laser wavelength to a band 0.003 to 0.005 nm through wavelength selectors such as Fabry-Perot etalon (hereinafter simply called etalon), grating and the like which are provided on the laser, and thus preventing a chromatic aberration from arising. However, the wavelength of a light oscillated from the laser fluctuates considerably large immediately after the laser starts oscillating. Further, the wavelength may fluctuate even after stabilized to a certain degree, as the wavelength selectors are subjected to an influence of mechanical vibration, temperature, atmospheric pressure and others. Accordingly, if such fluctuation of the wavelength, namely a variation of the center wavelength of a laser light to a set wavelength exceeds a predetermined tolerance ($\pm 0.001$ nm, for example), then since the projection lens for use on the laser has the abberation corrected only by a specific wavelength, fluctuations may arise on projection magnification, focal position, distortion and others according to the wavelength fluctuation, thus missing an exposure to be realized at high resolution. Consequently, it is important that a wavelength of the laser will be stabilized, or the center wavelength is matched with a set wavelength, and the wavelength variation is kept coming within a predetermined tolerance. Now, therefore, it is necessary that the wavelength selectors be controlled so as to stabilize the laser wavelength, thereby preventing fluctuations from arising on projection magnification, focal position, distortion and others due to the wavelength fluctuation. In case, for example, Fabry-Perot etalon is used as the wavelength selector, the etalon for wavelength selection will be inclined properly to an optical axis of the laser light through feedback control according to a variation of the laser light center wavelength to a wavelength set on a reference wavelength of mercury lamp or the like. A wavelength shift of the laser light is thus stabilized, and a reticle circuit pattern will be formed on a wafer at the best resolution characteristic at all times.

As mentioned above, in the stepper provided with this kind of laser, a stabilization of the laser light wavelength characteristic (or a stabilization of the center wavelength and wavelength width) is of importance, and a slight unstableness of the wavelength characteristic may cause fluctuations of projection magnification, focal position, distortion and others. For example, a laser light wavelength fluctuates heavily immediately after the laser recommences oscillation after shutdown for a predetermined time or longer, and hence a high precision (high resolution) of circuit pattern is not obtainable even from transferring the reticle circuit pattern onto a wafer in such state. Particularly, when the wavelength selectors are subjected to an influence of mechanical vibration and others during exposure to a wavelength fluctuation, a resist is sensitized unnecessarily as fluctuations arising on projection magnification, focal position and others due to the wavelength fluctuation, or a defective circuit pattern is printed on the wafer.

Consequently, when the stepper does not send an oscillation command (trigger signal) to a laser light source side for a predetermined period of time or over, namely, during replacement of a reticle or wafer, execution of alignment between the reticle and the wafer, the laser light source closes a shutter provided on a laser light outlet according to a command from the stepper, oscillates at a low frequency (1 to 2 Hz, for example) to a wavelength stabilization control, thereby preventing a wavelength fluctuation from arising at the time of restart of an oscillation command from the stepper (at the time of restart of exposure). An operation of the laser light source for oscillation regardless of a trigger signal from the stepper is defined as self-oscillation hereinafter.

In such system, the laser light source is operated for self-oscillation all the time while the laser light source is not used on the stepper side, therefore an arrangement is such that the self-oscillation is carried out at a constant low frequency so as not to shorten uselessly a lifetime of optical parts within the laser light source, parts for high tension control circuit (such as thyratron and others), or a lifetime of a gas for the laser.

However, there may be a case where a beam quality such as absolute wavelength, spectrum width, pulse energy or the like deteriorates unexpectedly (wavelength unlocked and so forth) for some reason such as, for example, a mechanical vibration of the laser light source or the stepper body, an incoming noise, a defective control of the etalon and others. Since the beam quality is monitored on the laser light side by spectroscope, detector and so forth, whether or not it has been deteriorated can be detected immediately by one pulse light emission, however, if the deterioration is considerably severe, then the etalon for stabilizing the beam quality is disabled from tracking control, and thus the laser light source gets down. Consequently, an operator is at the trouble of operating for start of the laser light source and recommencing an operation of the stepper in each occasion.

SUMMARY OF THE INVENTION

It is an object of this invention to provide a processor for recovering a beam quality within a short period of time without leaving a laser light source down despite the beam quality having been decided abnormal to deteriorate below standards while the laser light source operates for self-oscillation so as to stabilize the quality of a laser light, or during operation of a working device.

Now, therefore, the invention comprises operating the laser light source for self-oscillation at a low frequency band of, for example, 1 to 2 Hz by breaking it on intercepting means on the laser light source side such as shutter or the like when a laser light from the laser light source is not used for a predetermined period of time or over on a sequence of a working device side. The beam quality such as absolute wavelength, beam energy, spectrum width and so forth can thus be stabilized within standards on the laser light source side.

Further, the invention comprises providing abnormal detecting means for generating a quality abnormal signal upon detection of the beam quality having been outside the standards, and hence the construction is such that when the quality abnormal signal is outputted, the laser light source is operated for self-oscillation at a frequency band higher than the low frequency band of 1 to 2 Hz or so with the shutter closed therefor, thus quickening a feedback operation when the quality is detected abnormal.

According to this invention, a quality abnormal signal is generated to indicate that the beam quality of a laser light from the laser light source is abnormal, and while the abnormal signal is going, the working device side can be retained not to restart a sequence using the laser light.

Furthermore, a frequency band for the self-oscillation when a working process is interrupted on the sequence is retained at an extremely low frequency from taking a lifetime of the laser light source and control characteristics of beam quality adjusting means (such as wavelength stabilizing element, discharge voltage setting circuit and others) into consideration, and when the quality abnormal signal is outputted, the self-oscillation frequency band is increased to actuate the beam quality adjusting means at high speed, and thus the beam quality can be returned to an original state.

Normally, the self-oscillation is kept going when the laser light source is stand-by with reference to the working device, therefore an abnormity may arise rarely on the beam quality. Thus, if operating for self-oscillation at a high frequency band at the time of stand-by state according to the quality abnormal signal, a total pulse number in the lifetime of a laser gas is not so increased, and a lifetime of the laser light source will never be shortened extremely.

BRIEF DESCRIPTION OF THE DRAWINGS

FIG. 2 is a perspective view representing a construction for narrowing and stabilizing a wavelength band within a laser light source;

FIG. 3 is a block diagram representing a construction of a control system on a laser light source side according to the first embodiment;

FIGS. 4A to 4F are timing charts indicating a state of various signals at the time of normal operation;

FIGS. 5A to 5F are timing charts indicating a state of various signals at the time of return operation for beam quality abnormity in the first embodiment;

FIGS. 6A to 6F are timing charts indicating a state of various signals at the time of return operation for beam quality abnormity in a second embodiment;

FIGS. 11A to 11F are timing charts indicating a state of various signals at the time of a beam quality return operation according to a third embodiment of the invention;

DETAILED DESCRIPTION OF PREFERRED EMBODIMENTS

Figure 1:
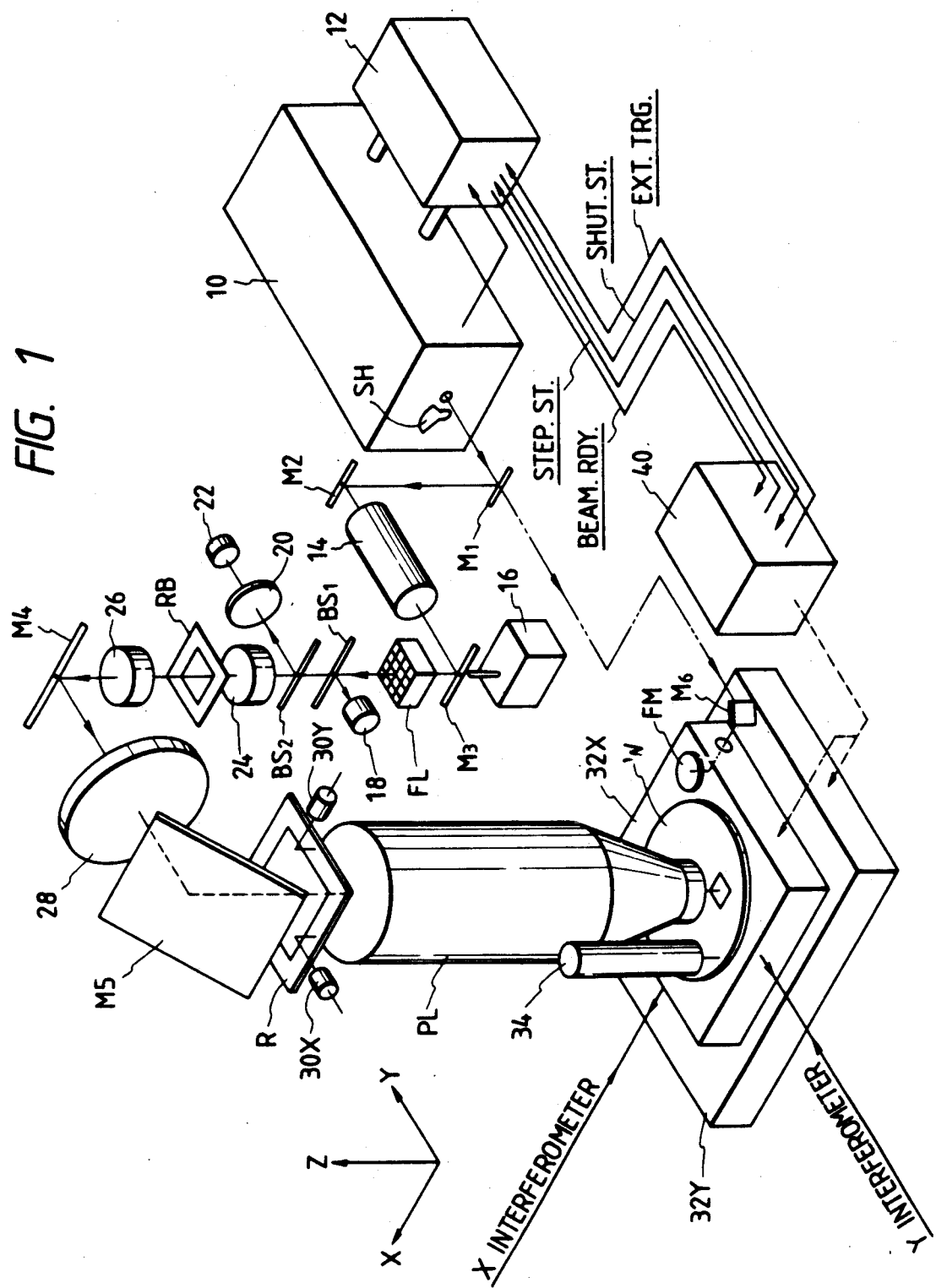
FIG. 1 is a perspective view representing a general construction of an exposure apparatus given in a first embodiment of this invention.

FIG. 1 is a perspective view representing a general construction of an exposure apparatus given in one embodiment of this invention.

A reference numeral 10 denotes a body portion of a laser light source, which is provided internally with a laser chamber in which a mixed gas such as rare gas halide or the like is enclosed, a front mirror (transmissive) and a rear mirror for resonance, wavelength selectors (diffraction grating, prism, etalon and the like) for narrowing a wavelength band, a spectroscope for monitoring an absolute value of oscillation wavelength, a detector for monitoring a laser power, a shutter SH and others.

A pulse light from the laser light source 10 is incident on a beam forming optical system 14 through a moving mirror $M_1$ and a fixed mirror $M_2$ and is formed into a predetermined sectional form and size. A laser light from the beam forming optical system 14 is reflected by a rocking mirror $M_3$ rocked within a predetermined angle by a driving unit 16, then incident on a fly-eye lens FL functioning as an optical integrator, and is transformed into a multiplicity of secondary light source images (spotlights). Each spotlight of beams formed on an emission side of each element lens of the fly-eye lens FL is transmitted through beam splitters $BS_1$, $BS_2$, and superposed on a reticle blind (variable lighting field diaphragm) RB to be almost uniform intensity distribution by a condenser lens system 24. The laser light having passed through the reticle blind RB illuminates a circuit pattern domain of a reticle R by way of a lens system 26, a fixed mirror $M_4$, a main condenser lens 28 and a fixed mirror $M_5$. Here, the reticle blind RB is conjugated with the reticle R by the lens system 26 and the main condenser lens 28. The reticle R is positioned by exclusive reticle alignment systems 30X, 30Y in the directions X, Y, $\theta$ with reference to an apparatus body. An image of circuit pattern of the reticle R is reduced and so projected onto a wafer W by a projection lens PL. The wafer W is placed on an X stage 32X, and the X stage 32X shifts in the direction X on a Y stage 32Y shifting on a base in the direction Y. Thus the wafer W shifts two-dimensionally along a projected image surface, and an exposure of step-and-repeat system is carried out. Then a reference mark plate FM having a transmission type reference slit is provided on the X stage 32X almost in the same height as the wafer W. Further, a mirror (not indicated) fixed on the X stage 32X is provided under the reference mark plate FM. The reference mark plate FM is disposed so as to receive a pulse light from the laser light source 10 from under through a plurality of mirrors and a mirror $M_6$ fixed on the Y stage 32Y when the moving mirror $M_1$ shifts aside from the indicated position. Laser beams incident on the mirror $M_6$ are almost parallel in luminous flux, parallel with Y-axis, reflected at right angles by the mirror M3 in the direction X, and then reflected vertically upward by a mirror under the reference mark plate FM. Accordingly, the laser beams are incident necessarily on a lower surface of the reference mark plate FM irrespective of how the X stage 32X and the Y stage 32Y shift.

Meanwhile, an alignment (mark detection) of the wafer W is effected by a wafer alignment system 34 of off-axis system. The wafer alignment system 34 operates for detecting photoelectrically an alignment mark on the wafer W at a specified position by means of an illumination light (uniform illumination or spotlight) of a wavelength band not to sensitize a resist layer on the wafer W. Further, the wafer alignment system 34 is fixed in a constant positional relation with the projection lens PL, however, since a relative positional relation between a mark detection center on the wafer W (index in the alignment system and spotlight) and a center of a projected image of circuit pattern of the reticle R varies slightly whenever the reticle R is replaced, the relative positional relation may be measured by means of the reference mark plate FM. Thus, a pulse light from a light emitting slit of the reference mark plate FM is partly branched through the beam splitter $BS_2$ disposed in an optical path of the illumination system, and received by a photoelectric element (photomultiplier or the like) through the lens system 20. A light receiving face of the photoelectric element 22 is disposed almost conjugationally with a pupil (incidence or emission pupil) of the projection lens PL by the lens systems 24, 26, 28 and others. Then, a multiplicity of secondary light source images formed by the fly-eye lens FL are focused on the incidence pupil of the projection lens PL, thereby realizing Köhler illumination.

Now, in the aforementioned construction, there is a thermal chamber partition for containing a body of the exposure apparatus (stepper) provided between the moving mirror $M_1$ and the laser light source 10, and the laser light source 10 is installed externally of the thermal chamber. Then, the stepper body is governed by a main controller 40, operating for shift of the XY stages 32X, 32Y, positioning of the reticle R by the reticle alignment systems 30X, 30Y, detection of a position of the wafer W by the wafer alignment system 34, setting of the reticle blind RB, operation for checking a series of relative positional relation by means of the photoelectric element 22 and the reference mark plate FM, exposure amount control operation by means of a photoelectric element 18 for receiving a part of the pulse light reflected by the beam splitter $BS_1$, or operation for decreasing a spectrum (interference streak caused by an interference of the laser beams) according to vibrations of the rocking mirror $M_3$.

Positions of the XY stages 32X, 32Y are successively measured by a laser interference type measuring device (interferometer) as coordinate values, and the coordinate values are inputted also to the main controller 40 and used for various position measurements. The aforementioned construction of the stepper side exemplifies the invention as one aspect only and hence is not necessarily limited thereto.

Here, a system for stabilizing the wavelength working as one factor of the beam quality will be described with reference to FIG. 2. FIG. 2 represents a structure in the laser light source 10, wherein a front mirror 102 and a rear mirror 106 are disposed across a laser chamber 100 so as to satisfy resonance conditions, and an etalon 104 for narrowing and stabilizing a wavelength band is provided for ready inclination between the rear mirror 106 and the laser chamber 100. An electrode in the laser chamber 100 has a high voltage impressed thereon in pulse form from a control system 12, thereby generating a one-pulse laser oscillation. Laser beams emitted from the front mirror 102 are partly reflected by a beam splitter 110, further reflected by a beam splitter 112 and then incident on a spectroscope 114 for monitoring wavelength change. The spectroscope 114 comprises a monitoring etalon, a diffraction grating and others, measuring a change in absolute wavelength of an emitted laser light LB by means of a reference light MB (specific bright line such as Hg lamp or the like). A measured variation is sent to the control system 12, and also delivered to a control circuit 116 of a motor 108 for driving the etalon 104. The control circuit 116 drives the motor 108 for inclining the etalon 104 so as to adjust the measured variation of absolute wavelength to almost zero. Further, the control circuit 116 generates signals indicating an amount and state of drive to the control system 12, and also inputs commands such as offset signal and others from the control system 12. Then, a photoelectric detector 118 comprises measuring a quantity of light at each pulse of the oscillated laser light LB (or peak level thereof), and as adjusting a high voltage impressed on the electrode in the laser chamber 100 according to a signal from the detector 118, the control system 12 controls the quantity of light within an almost constant dispersion width. An operation for adjusting the quantity of light is also one of those for keeping the beam quality constant.

In the aforementioned construction, a pulse oscillation of the laser chamber 100 is also necessary for wavelength stabilization, and thus when the pulse oscillation of several Hz to 500 Hz or so is required on the stepper side for exposure, measurement and so forth, a feedback loop for the wavelength stabilization functions according to the oscillation, thereby obtaining an almost ideal stability. However, if oscillation of the laser chamber 100 is interrupted, then the wavelength stabilizing loop will not operate thereafter, and when the next oscillation ensues after a certain period of time, the first pulse wavelength may sometimes be deformed heavily. Now, therefore the shutter SH indicated in FIG. 1 is closed, the laser light source 10 is operated for self-oscillation at 1 to 2 Hz to actuate the wavelength stabilizing loop all the time, thereby effecting a stabilization of the quantity of light from wavelength locking and high voltage adjustment.

Now in this embodiment, four pieces of interface signals are provided between the main controller 40 on the stepper side and the control system 12 on the laser light source side, thereby realizing a coordination control. Needless to say other interface signals are naturally provided, however, the illustration refers only to those which are concerned with this invention. Designations and functions of the four interface signals are as follows:

SIGNAL EXT. TRG. (EXTERNAL TRIGGER)

A trigger signal for emission of a laser light from the stepper body to the laser light source, the laser light source side generating a discharge between electrodes in the laser chamber in response to an edge detection of the signal, thereby emitting the laser light. One trigger signal coordinates with one-pulse laser light emission.

SIGNAL STEP. ST. (STEPPER STATUS)

A level signal for commanding the operation mode from the stepper body to the laser light source, the laser light source 10 emitting, at the time of Lo, the laser light one pulse by one synchronously with EXT. TRG. signal from the stepper body. When the signal is Hi, the laser light source 10 closes the shutter SH, operates normally for self-oscillation at a proper low frequency (1 to 2 Hz, for example), thus functioning for locking an absolute wavelength and setting a discharge voltage for stabilizing a quantity of light.

SIGNAL SHUT. ST. (SHUTTER STATUS)

A level signal indicating a shutter position in the laser from the laser light source 10 to the stepper body, coming in Hi level at "open" and Lo level at "closed" in this embodiment. As timing for changing the level, Hi changes to Lo after the shutter SH is closed full when closing the shutter SH, but Lo is changed to Hi after it is open full when opening.

SIGNAL BEAM RDY (BEAM READY)

A binary signal (beam quality abnormal signal of this invention) indicating a degree of the beam quality outputted from the laser light source 10 side to the stepper body, coming in Lo level (OK) when quality elements such as absolute wavelength of an oscillated laser light, pulse energy, spectrum width and so forth come all within a tolerance (standard conforming with exposure or measurement of the stepper), but Hi level (NG) when any of the quality elements comes outside the tolerance.

As described above, a coordination control between the laser light source side and the stepper body side is effected in the embodiment according to the four interface signals relating to this invention.

Now, FIG. 3 is a block diagram representing a construction of the control system 12 on the laser light source 10'side, wherein like reference characters denote like members in FIG. 2.

Main electrodes 100A, 100B for discharge are provided within the laser chamber 100 indicated in FIG. 2, and pulses as high as several ten KV are impressed thereon by a high pressure discharge circuit 120. A discharge voltage adjusting circuit 121 decides whether or not a pulse energy measured on the power detector 118 in FIG. 2 comes within a constant range with reference to a command, and where the pulse energy comes lower than the range, a voltage to be impressed on the main electrodes 100A, 100B is stepped up, but where higher, the voltage is stepped down. Then, the adjusting circuit 121 generates a signal $SS_1$ indicating "normal" (OK) to an abnormal detecting circuit 123 when the measured pulse energy comes within the constant range. The abnormal detecting circuit 123 further inputs a signal $SS_2$ outputted from the spectroscope 114. The signal $SS_2$ indicates whether or not an absolute wavelength of the oscillated laser light LB is locked correctly to the command. Further the abnormal detecting circuit 123 inputs a signal $SS_3$ indicating whether or not a spectrum width of the laser light has a gap with reference to a set point. The signal $SS_3$ is generated by the spectroscope 114. When using a monitoring etalon as the spectroscope 114, a laser light is made incident on the monitoring etalon with an angle of divergence, a change in diameter of the interference streak (ring belt form) is measured to monitor a change in the wavelength, and a change in thickness of one interference streak (bright line) is measured to monitor a change in the spectrum width.

As described above, the three signals $SS_1$, $SS_2$, $SS_3$ are factors for determining a beam quality of the laser light, and the abnormal detecting circuit 123 sets the signal BEAM RDY to Hi level (NG) when even one of the three signals $SS_1$, $SS_2$, $SS_3$ indicates an abnormity.

On the other hand, a trigger signal SG impressed on the high pressure discharge circuit 120 is transferred by a change-over switch selectively to a case where provided from the stepper body side as signal EXT. TRG. or to a case where provided from an oscillation circuit 122. The switching operation is carried out according to signal STEP. ST. from the stepper body side.

The oscillation circuit 122 is so provided for self-oscillation of the laser light source 10, however, the oscillation frequency is variable either selectively or continuously within a certain range in this embodiment. An upper bound of the range is determined by a maximum value whereat the laser light source 10 is capable of oscillating stably, and is 200 to 500 Hz or so dependently on the laser light source. The maximum oscillation frequency is also a value required for maximizing a throughput when the stepper side exposes one shot on the wafer W in a plural pulse (several ten pulses or over). Then a lower bound frequency of the oscillation circuit 122 depends on how long pulse interval (seconds) to perform a dummy oscillation during the period of time when a laser light from the laser light source 10 is not totally utilized by the stepper side, that is, during a standby mode. The pulse interval for self-oscillation is determined so that it becomes longest within the range in which the wavelength stabilizing loop shown in FIG. 2 is capable of tracking at stable precision. Now, therefore, in this embodiment, with the maximum oscillation frequency of the oscillation circuit 122 as 200 Hz and the minimum oscillation frequency as 1 Hz, the oscillation frequency is made variable arbitrarily therebetween.

Further in this embodiment, the oscillation circuit 122 is constructed such that the oscillation circuit 122 will generate the trigger signal SG at the minimum oscillation frequency or at a frequency (1 to 5 Hz) several times as high as that when the signal BEAM RDY from the abnormal detecting circuit 123 to Lo level (OK) and that the trigger signal SG will be generated at the maximum oscillation frequency or at one of the frequencies (200 to 40 Hz) lower than that when the signal BEAM RDY is Hi level (NG). It is desirable that the return be made at high speed when abnormity such as wavelength locking miss or the like arises, therefore the trigger signal SG will be generated normally at the maximum oscillation frequency when the signal BEAM RDY is NG.

Then, when a lifetime of the gas in the laser chamber 100 is pressing, the trigger signal SG will be generated at a frequency lower than the maximum frequency according to a value of total pulse number for oscillation from the time when the gas was replaced previously, thereby keeping the quality (or pulse energy particularly) at each pulse light. Further in FIG. 3, the signal STEP. ST. is used for operating the shutter SH in FIG. 1, and a position detection system of the shutter SH outputs the signal SHUT. ST. to the stepper side by way of the control system 12.

Next a control operation of this embodiment will be described, however, an exposure operation and an alignment operation in the stepper of this embodiment will be described briefly each in advance thereof.

The exposure is effected at several ten pulses or over with reference to a one shot domain on the wafer W for the relation between a speckle decrease and a control precision of the amount of exposure. The speckle decrease is carried out on a system wherein an interference streak produced on an image by using the fly-eye lens FL is moved fine in a pitch direction by oscillating laser pulses as deflecting the rocking mirror $M_3$ by minute angles, and after the one-shot exposure is completed a contrast of the interference streaks on the wafer W is suppressed to such extent as is almost not influential practically (±1% or so as a contrast value). In this case, an angle of deflection (half-period) $\alpha$ of the rocking mirror $M_3$ which is necessary for decreasing a contrast of the interference streaks on the image (wafer surface) and a number $N_p$ of laser pulses necessary with reference to the angle of deflection $\alpha$ are determined in disambiguation through experiment.

On the other hand, a proper amount of exposure Ev of one shot is determined naturally according to kind and thickness of the resist, therefore it is necessary that an average pulse energy Ep be set by an extinction filter or other means to exposure for equilibrium with a pulse number K.Np (K being integer increasing one by one at every half-periods of the angle of deflection $\alpha$ of the rocking mirror $M_3$) necessary for the speckle decrease. At the time of exposure a real energy of each pulse light detected by the photoelectric element 18 is integrated and whether or not it reaches the proper amount of exposure is monitored. Or otherwise, a high-speed variable extinction filter is provided this side of the fly-eye lens FL, and with conditions of the pulse number K.Np and the angle of deflection $\alpha$ satisfied, energies detected at every pulse emissions by the photoelectric element 18 are successively integrated, the real integrated value is compared with a target integrated value (calculated value) at the point in time, and an energy for the next pulse emission is adjusted fine through the high-speed variable extinction filter or the discharge voltage adjusting circuit 121 of the laser light source 10 according to a difference between the real integrated value and the target integrated value. A laser oscillation during the aforementioned operation for exposure is effected on the signal EXT. TRG. from the stepper side, however, a frequency of the signal EXT. TRG. is set so as to come near to the maximum oscillation frequency to the utmost for the best possible throughput.

For alignment operation on a laser light, the transmission slit of the reference mark plate FM is run by the XY stages in the direction intersecting longitudinally of the slit of the mark plate FM one-dimensionally within the projected image, the slit image is focused o a transmission slit mark on the reticle R, the laser light having passed through the slit mark is received on the photoelectric element 22 by way of the mirror $M_5$, the condenser lens 28, the mirror $M_4$, the lens systems 26, 24, the beam splitter $BS_2$, and a projection position of the slit mark of the reticle R is recognized on a shift coordinate system of the XY stages. In this case, the laser light source 10 generates the signal EXT. TRG. for pulse oscillation in response to a measurement pulse from a laser interferometer from the stepper side. Since the laser interferometer outputs a measurement pulse (updown pulse) whenever the XY stages 32X, 32Y shift, for example, at 0.01 μm, the main controller 40 divides the measurement pulse properly to obtain the signal EXT. TRG. Then, a photoelectric signal level from the photoelectric element 22 is subjected to a digital sampling by an A/D converter after oscillation of the pulse light, and stored in a memory in an address order at every pulse emissions. The address coordinates with the coordinate position of the XY stages in disambiguation. However, an energy of the laser light has a dispersion of ± several % to several ten % per pulse, therefore a photoelectric signal from the power detector 118 in the laser light source 10 is loaded at every pulse emissions, and a level of the photoelectric signal of the photoelectric element 22 is normalized by a divider or the like. Then, a reference detector for normalization may be provided within the stepper body, or is arranged otherwise to receive the pulse light branched by a beam splitter provided near the mirror $M_6$ on the stage in FIG. 1 in the concrete. When actuating the reference mark plate FM for emission, the trigger signal SG is generated in response to the up-down pulse from the laser interferometer, therefore a moving rate of the stages 32X, 32Y is controlled so as to keep the trigger signal SG from exceeding the maximum oscillation frequency.

According to the aforementioned operation, a projection position of the slit mark of the reticle R (or the reticle center) is specified as a value of the shift coordinate system of the XY stages. Further, a position of the XY stages at the time when slit and others on the reference mark plate FM are seized at a detection center of the wafer alignment system 34 is read by the laser interferometer, thereby specifying a relative positional relation in the shift coordinate system between the projection center of the reticle R and the detection center of the wafer alignment system 34.

There is a sequence using the reference mark plate F in that for checking various optical characteristics of the projection lens PL by means of a test reticle and also for checking the best imaging position of the projection lens PL other than the above-described operation, and in this case the laser light source 10 is also triggered in response to the signal EXT. TRG. from the stepper body side.

Then in such various sequences using the laser light from the laser light source 10, an operation for triggering pulses of the laser light in continuation is intermittent, and when the intermittent time becomes longer than the period coordinating with the minimum oscillation frequency, a self-oscillation of the laser light source 10 may sometimes be required according to the length of such time.

Next, an operation of this embodiment will be described with reference to FIG. 4 and FIG. 5. FIGS. 4A to 4F are timecharts exemplifying an operation in ordinary case (the signal BEAM RDY being Lo level) where the beam quality is not NG. FIGS. 4A, 4C, 4D, 4F indicate states of the signals STEP. ST., SHUT. ST., EXT. TRG., BEAM RDY respectively, FIG. 4B indicates a positioned state of the shutter SH of the laser light source 10, and FIG. 4E indicates a triggered state of a self-oscillation pulse by the oscillation circuit 122 in the control system 12 of the laser light source 10.

Now in FIG. 4A, terms A and C when the signal STEP. ST. is Lo level indicate an execution of ordinary wafer exposure, and a term B when it is Hi level indicates a state wherein the stepper body does not send an emission trigger for several seconds or longer to the laser light source 10, or, for example, an operation is carried out for wafer replacement, reticle alignment by the reticle alignment systems 30X, 30Y, wafer alignment by the wafer alignment system 34 and so forth. In the term A, an exposure is repeated to one piece of wafer W at every shots in a step-and-repeat system, however, a trigger pulse train of the signal EXT. TRG. shown in FIG. 4D is impressed on the high pressure discharge circuit 120 through a switch in FIG. 3 in this case, and each set S of the pulse train coordinates with a one-shot exposure. Then, a stepping time between shots is normally 1 second or below.

Now, when the stepper ends the exposure (term A) to one piece of wafer, the control system 40 changes the signal STEP. ST. from Lo to Hi at a point in time $t_{11}$. The laser light source 10 having recognized this starts closing the shutter SH, adjusts the signal SHUT. ST. to Lo at the point in time $t_{12}$ when the shutter SH has been closed full, transfers the high pressure discharge circuit 120 to connect to the trigger signal SG from the oscillation circuit 122, starts then a self-oscillation, as shown in 4E, at a frequency of several Hz or lower, thus locking (feedback controlling) pulse energy, absolute wavelength and others.

The stepper body carries out an operation for which the laser light source is not used (for example, wafer replacement, wafer alignment and so forth) during the term (term B), and changes the signal STEP. ST. from Hi to Lo at the point in time $t_{13}$ ready for exposure of the next wafer W. The control system 12 of the laser light source having recognized it stops the oscillation circuit 122 for self-oscillation and transfers the trigger input signal SG of the high pressure discharge circuit 120 to the signal EXT. TRG. side, then starts opening the shutter SH, and changes the signal SHUT. ST. from Lo to Hi at the point in time $t_{14}$ when the shutter SH has opened full.

Upon recognition the stepper body outputs the set S of trigger pulse trains at every shots as the signal EXT. TRG. so as to start an exposure operation to the next wafer W (term C). Then, a stepping of the XY stages 32X, 32Y comes between the sets S and S of the pulse trains.

In the aforementioned operation, the trigger signal SG is generated at low frequencies (1 to 2 Hz) in the term B, and then the high pressure discharge circuit 120 operates so as to be kept at a predetermined pulse energy by a function of the adjusting circuit 121. The wavelength stabilizing loop also operates concurrently therewith, and thus an absolute wavelength of the laser light is kept constant. During the period of time, the abnormal detecting circuit 123 keeps to monitor the signals $SS_1$, $SS_2$, $SS_3$ for determining the beam quality, however, in the case of FIG. 4, all indicate "normal", therefore the signal BEAM RDY during the term B remains as Lo level (OK).

FIGS. 5A to 5F are timing charts indicating an operation when the beam quality is found NG while the laser light source operates for self-oscillation, wherein FIGS. 5A to 5F are same as those of FIGS. 4A to 4F. As indicated in FIGS. 5A, 5B, 5C, when the signal STEP. ST. is Hi level the shutter position is closed, and the signal SHUT. ST. is Lo level (closed) to self-oscillation mode, the oscillation circuit 122 generates the trigger signal SG at low frequencies. When the abnormal detecting circuit 123 detects abnormity on any of the signals $SS_1$, $SS_2$, $SS_3$ during the mode, the signal BEAM RDY turns over from OK (Lo level) to NG (Hi level) as shown in FIG. 5F ($t_{21}$). When the signal BEAM RDY becomes NG, the oscillation circuit 122 is switched so as to generate the trigger signal SG, as indicated by 50 in FIG. 5E, at a preset high frequency (value suitable for returning the beam quality at a shortest possible time), or at the maximum oscillation frequency 200 Hz. for example, thus returning the beam quality at high speed.

In the case of laser light source 10 exemplified in this embodiment, where it is found through experiment that an abnormity of the beam quality is caused in most cases by unlocking of a servo for wavelength stabilization, the laser light is oscillated as changing an inclination of the etalon in FIG. 2 infinitesimally, and the absolute wavelength is monitored successively by the spectroscope 114, thus adjusting the inclination of the etalon 104 to a desired position. In this case, when a wavelength of the laser beam is largely dislocated according as the servo locking is released, a multiplicity of pulses will be required therefor, and hence the self-oscillation frequency is increased as indicated by 50 in FIG. 5E, thereby obtaining a locked state at high speed.

Thus, when the beam quality is returned to a normal state at the point in time $t_{22}$, the abnormal detecting circuit 123 of the control system 12 turns the signal BEAM RDY over to Lo level (OK). The oscillation circuit 122 then generates the trigger signal SG at a low frequency normally, and a normal self-oscillation is recommenced.

Since the stepper body side carries out an operation not to have access to the laser light source 10, an abnormity detection and normal return operation of the beam quality will be carried out regardless totally of an operation sequence of the stepper.

Next, as shown in FIG. 5F when an abnormity arises again on the beam quality and thus the signal BEAM RDY becomes NG at the point in time $t_{23}$, the laser light source 10 then operates for self-oscillation on the trigger signal SG high in frequency for high-speed return as indicated by 51 in FIG. 5E. The stepper side then has access to the laser light source 10 halfway of the self-oscillation, or at the point in time $t_{24}$ when the signal BEAM RDY is NG (Hi level).

In this case, the control system 40 on the stepper side monitors the signal BEAM RDY before changing the signal STEP. ST. to Lo level, stops turning over the signal STEP. ST. to Lo level when the signal BEAM RDY is NG (Hi level), and keeps monitoring the signal BEAM RDY. On the other hand, the laser light source side keeps running a high-speed return of the beam quality as the signal BEAM RDY is NG, and changes the signal BEAM RDY to Lo level (OK) at the point in time $t_{25}$ when the beam quality is returned. The oscillation circuit 122 is then switched to the normal low frequency (1 to 2 Hz).

However, the control system 40 on the stepper side having kept monitoring the signal BEAM RDY detects a change in the signal BEAM RDY to Lo level (OK), and thus changes the signal STEP. ST. to Lo level (EXPOSURE) at the point in time $t_{26}$. Thus the trigger signal SG to the high pressure discharge circuit 120 is changed to the signal EXT. TRG. from the stepper body side. Then the laser light source side starts opening the shutter SH according to a change in the signal STEP. ST. to Lo level, changes the signal SHUT. ST. from Lo to Hi level (OPEN) at the point in time $t_{27}$ when opened full, and then the control system 40 on the stepper side outputs the set S of trigger pulse trains at every shots as the signal EXT. TRG., as shown in FIG. 5D, so as to commence an exposure operation to the wafer.

The above description has referred to a high-speed return in stand-by mode before entering the next wafer exposure in the operation of FIG. 5, however, the same operation will occur where an access must be made to the laser light source 10 during the wafer replacement or at the time of reticle replacement, and when access is made to the laser light source 10, the signal STEP. ST. will be changed t Lo level after the stepper control system 40 monitors the signal BEAM RDY.

Next, a second embodiment of this invention will be described with reference to FIG. 6, however, what is different from the first embodiment is that the signal BEAM RDY is also recognized at the time other than the self-oscillation mode, that is, at the time of oscillation mode by the signal EXT. TRG., and the basic construction is same as FIG. 1, FIG. 2 and FIG. 3. FIG. 6 represents a state of each signal when an abnormity arises on the beam quality on the way to the stepper exposing shot domains $S_1, S_2 \ldots$ on the wafer one after another, wherein each of FIGS. 6A to 6F is same as FIGS. 4A to 4F or FIGS. 5A to 5F.

Since the signal STEP. ST. is Lo level and the signal BEAM RDY is Lo level (OK) as far as the shot domains $S_1, S_2$, the exposure goes normally on in an oscillation mode by the signal EXT. TRG. However, the abnormal detecting circuit 123 changes the signal BEAM RDY immediately to NG at the point in time $t_{61}$ when an abnormity arises on the beam quality for some reason or other during exposure of the shot domain $S_3$. The stepper control system 40 monitors the signal BEAM RDY, and when the signal BEAM RDY is NG (Hi level), it interrupts immediately a delivery of the signal EXT. TRG. to the high pressure discharge circuit 120. Concurrently, the control system 40 stores exposure information such as a coordinate position (measured value on the stage interferometer) of the then shot domain $S_3$, an amount of exposure provided to the shot domain $S_3$ so far, an angle of the rocking mirror $M_3$ for decreasing an interference streak (speckle) at the time of final pulse emission and so forth, and provides for reexposure to the shot domain $S_3$ when the beam quality returns to a normalcy. The control system 40 then changes the signal STEP. ST. to Hi level (NOT EXP.) ($t_{62}$). Upon receipt the laser light side starts closing the shutter SH, and changes the signal SHUT. ST. to Lo level (CLOSED) at the point in time $t_{63}$ when the shutter SH is completely closed.

Figure 7:
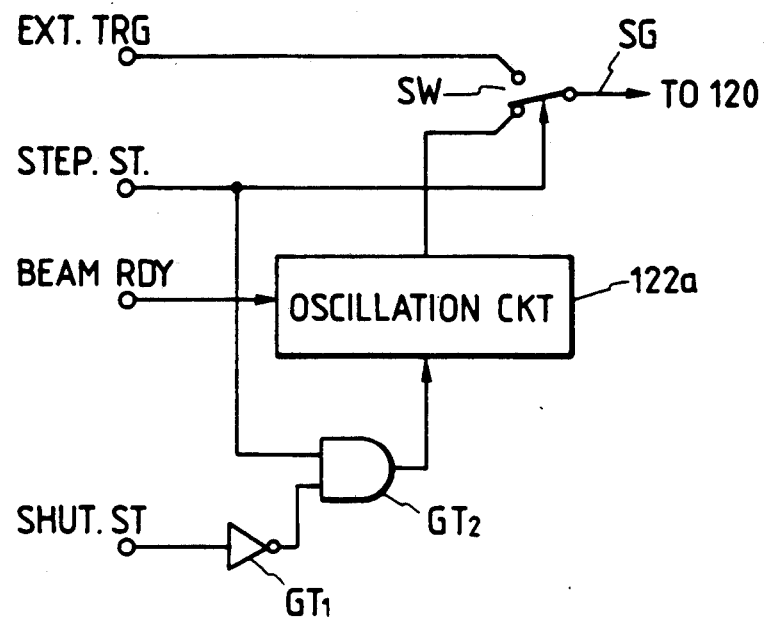
FIG. 7 is a block diagram showing a circuit preferable for the second embodiment.

On the other hand, an oscillation circuit 122a has a construction ready for inputting the signals SHUT. ST. and STEP. ST. as control signals, as shown in FIG. 7, other than the signal BEAM RDY, obtains a logical product (AND) of a signal to which the signal SHUT. ST. is turned over by an inverter $GT_1$ and the signal STEP. ST. through an AND gate $GT_2$, and controls to operate for self-oscillation only when the AND signal is Hi level. Or otherwise, a switch Sw will be transferred on an output level of the AND gate $GT_2$, and the switch Sw may be transferred to the oscillation circuit 122a side when the AND signal is Hi level.

According to the construction, the trigger signal SG from the oscillation circuit 122a is impressed on the high pressure discharge circuit 120 from the point in time $t_{56}$ when the signal SHUT. ST. is closed, and goes into a return operation 60 of the beam quality. In this case, since the signal BEAM RDY has already been NG (Hi level), an oscillation frequency of the oscillation circuit 122a is changed to a high frequency (for example, the maximum oscillation frequency 200 Hz) from the beginning.

During the quality return operation, the stepper side monitors the signal BEAM RDY, and when the signal BEAM RDY changes to OK (Lo level) at the point in time $t_{64}$ when the return operation is over, the signal STEP. ST. is returned immediately to Lo level (EXPOSURE). Then the laser light side stops oscillation of the oscillation circuit 122a, transfers the switch Sw to the signal EXT. TRG. side, and starts opening the shutter SH at the same time. The control system 12 changes the signal SHUT. ST. to Hi level (OPEN) at the point in time $t_{65}$ when the shutter SH is opened completely. Immediately after the signal SHUT. ST. changes to Hi level, the stepper side starts outputting pulse trains of the signal EXT. TRG., and restarts an exposure operation to the shot domain $S_3$.

According to the above-described second embodiment, while the stepper side is running an access operation to the laser light source 10, since the step is ready for copying with an abnormity of the beam quality, the wafer in exposure will be kept from being defective, and a yield may be enhanced.

From combining operations of the first and the second embodiments of this invention, a probability of the laser light source side getting down due to an abnormity of the beam quality will be minimized, and an operating ratio of the exposure apparatus as a whole may be improved. Further, while an alignment system of TTL system (or TTR system) for detecting a wafer mark through the projection lens PL is not provided on the stepper given in each embodiment, however, this may be provided properly in the similar system to a conventional stepper.

An improvement realizable from combining the first and the second embodiments will be described with reference to FIG. 8 and FIG. 9.

Figure 8:
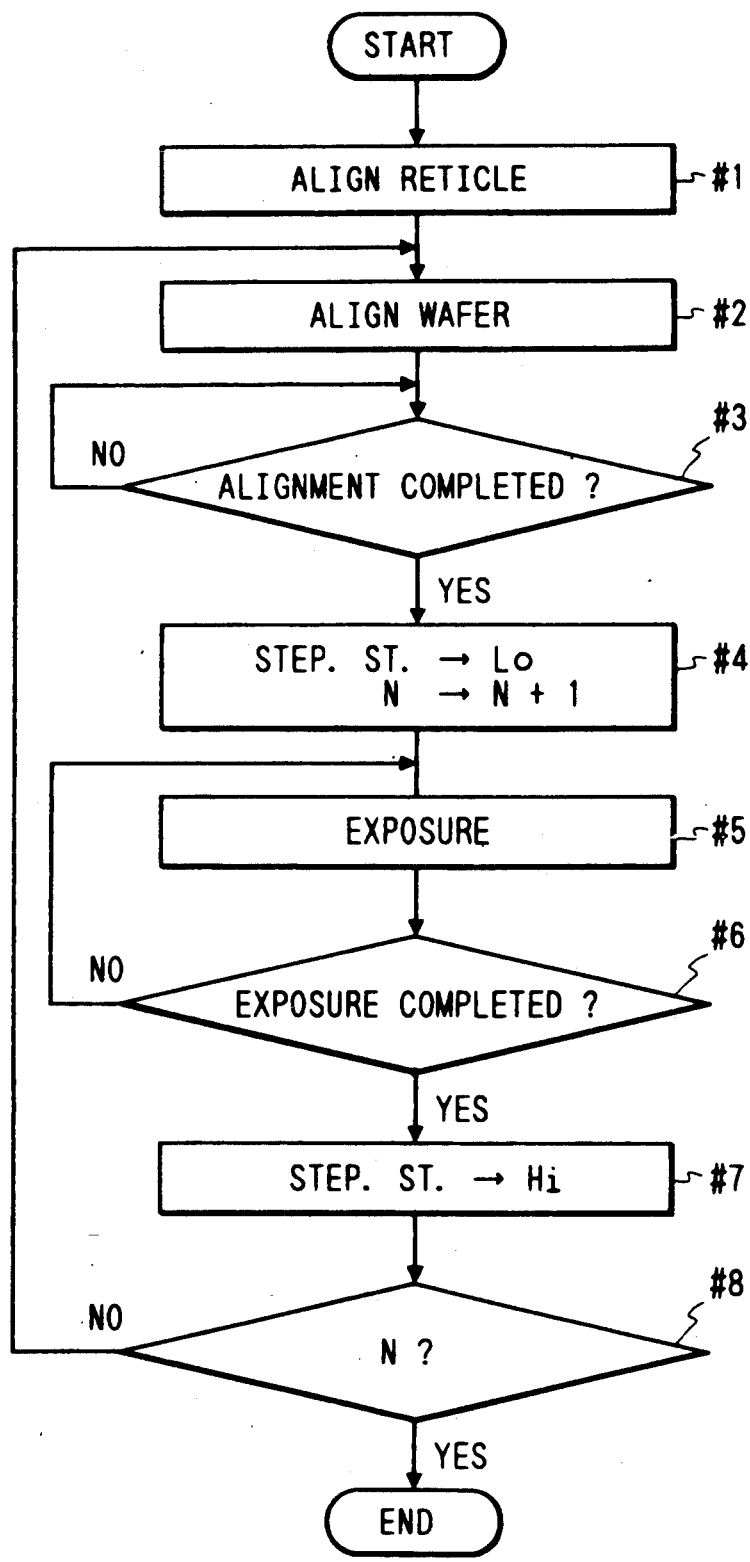
FIG. 8 and FIG. 9 are flowcharts indicating an operation of examples with the first and second embodiments of the invention combined therefor each.

FIG. 8 is a flowchart for indicating an ordinary routine of the improvement. The signal STEP. ST. before the routine starts is Hi level. First, the reticle is aligned in step #1. The wafer is aligned globally in step #2, and whether or not the global alignment of the wafer is completed is decided in step #3. When the global alignment of the wafer is completed, the shutter is opened with the signal STEP. ST. as Lo, and N is increased by one in step #4. The value of N is zero at first. In step #5, a predetermined plural domain of the wafer is exposed by reticle. In step #6, whether or not all the domains of the wafer are exposed is decided. In step #7, the shutter is closed with the signal STEP. ST. as Hi level. In step #8, whether or not a predetermined number N of wafers have been exposed is decided, and if so, then the routine ends.

Figure 9:
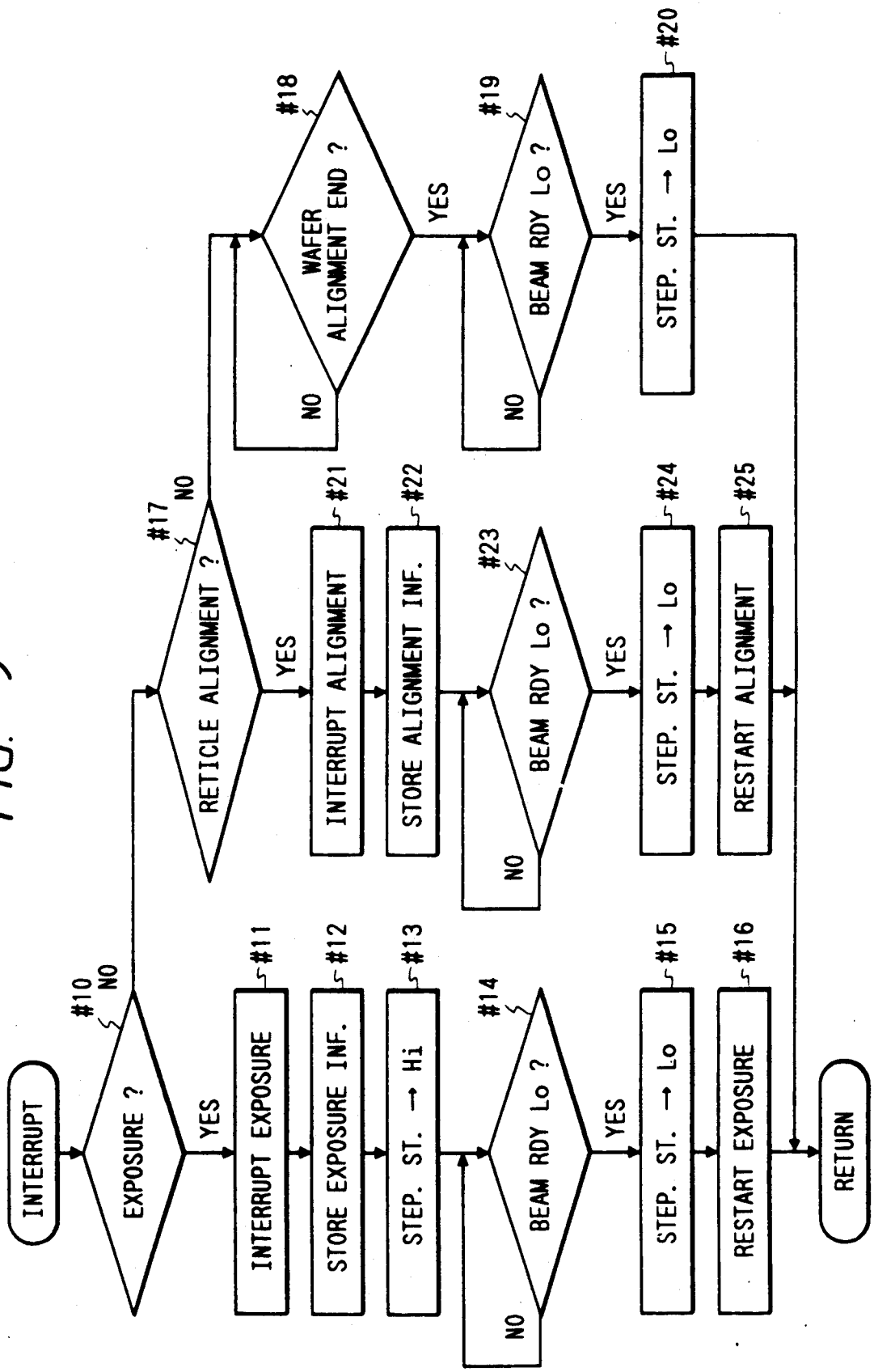

FIG. 9 indicates an interruption routine of the improvement, starting in response to the signal BEAM RDY being Hi. In step #10, whether or not an exposure operation of the wafer is carried out is decided. If so, then the exposure operation is stopped in the next step #11, and exposure information is stored in an internal memory in step #12. The shutter is opened during the exposure operation, therefore the shutter is closed by changing the signal STEP. ST. to Hi level in step #13. In step #14, whether or not the signal BEAM RDY is Lo level is decided, and if Lo, then the process shifts to step #15 to change the signal STEP. ST. to Lo level. In step #16 the exposure operation is restarted according to the exposure information stored in step #12, and the process returns to the routine of FIG. 8. Operations covering step #11 to step #16 coordinate with the operations described with reference to FIGS. 6A to 6F.

In step #17 whether or not the operation is carried out for reticle alignment is decided, and if not, the process shifts to step #18 for wafer alignment. In step #18 whether or not the alignment is over is decided, and when the wafer alignment is over, whether or not the signal BEAM RDY is Lo is decided in step #19. If the signal BEAM RDY is Lo level, then the process shifts to step #20 to change the signal STEP. ST. to Lo, and returns to the routine of FIG. 8. Operations covering step #18 to step #20 coordinate with the operation of FIGS. 5A to 5F.

In the case of reticle alignment so decided in step #17, the reticle alignment is stopped in step #21, and position information of the reticle and alignment information on a detected light intensity are stored in the internal memory in step #22. In step #23 whether or not the signal BEAM RDY is Lo is decided, and if Lo, then the process shifts to step #24 to change the signal STEP. ST. to Lo level. In step #25, the reticle alignment operation is restarted according to the alignment information stored in step #22, and the process returns to the routine of FIG. 8.

Figure 10:
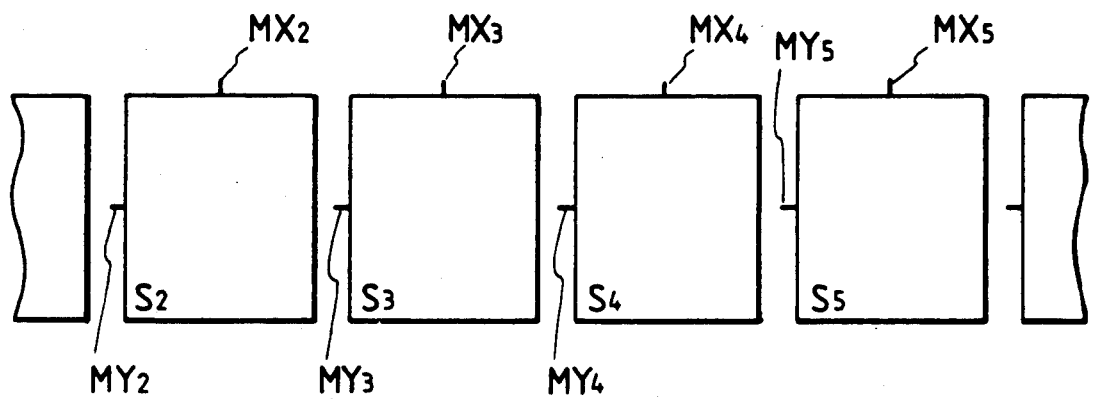
FIG. 10 is a plan view showing an array of shot domains on a wafer.

Next, an operation of a third embodiment of this invention will be described with reference to FIG. 10 and FIG. 11. FIG. 10 indicates a disposition of shot domains $S_2$, $S_3$, $S_4$, $S_5$ ... coming in one row arranged in the direction X on the wafer W, and alignment marks MXn, MYn are put incidentally to each shot domain. FIGS. 11A to 11F indicate changing states of the same signals as the timing charts of FIGS. 6A to 6F.

Now, as described in the second embodiment (FIG. 6), when an exposure operation to the wafer is interrupted halfway of the shot domain $S_3$ for abnormity of the beam quality, the oscillation circuit 122 operates for self-oscillation at high frequencies as indicated by 90 in FIG. 11E. However, while the stepper side is stand-by in such state (XY stages 32X, 32Y being stopped at exposure position of the shot domain $S_3$), the time for the signal BEAM RDY to return to OK from NG (point in time $t_{91}$) will be added straight to a processing time of one wafer, thus causing a deterioration of throughput.

Now, therefore, in this embodiment, the control system 40 (or the control system 12) will be provided with a circuit or a software (program) for deciding how much the beam quality abnormity is important. The decision means counts a period of time from the point in time when the signal BEAM RDY becomes NG (Hi level), and monitors whether or not the value exceeds (time being over) a preset time value (for example, an exposure time for one shot, or a stepping time). The stepper side shifts the XY stages 32X, 32Y at the point in time $t_{90}$ when the time being over is detected by the decision means during a high-speed return operation of the beam quality (the signal BEAM RDY being NG), then operates for alignment of the next shot domain $S_4$; or concretely detects marks $MX_4$, $MY_4$ on the alignment system of TTL system or off-access system, and shifts to the operation for deciding an exposure position of the shot domain $S_4$ precisely. A term Ta of FIG. 11A indicates a time for alignment operation to the adjacent shot domain $S_4$ (operation for determining the exposure position).

On the other hand, a self-oscillation of the oscillation circuit 122 at high frequencies is stopped in response to a return of the signal BEAM RDY from NG to OK at the point in time $t_{91}$ having passed somewhat after the term Ta began, however, the stepper side operates for alignment then, and the signal STEP. ST. remains as Hi level (NOT EXP.). Accordingly, the oscillation circuit 122 is changed to a low frequency (1 to 2 Hz) from the point in time $t_{91}$ when the signal BEAM RDY becomes OK, and keeps operating for self-oscillation.

Thus the stepper side checks a state of the signal BEAM RDY at the point in time $t_{92}$ when the term Ta comes to an end, and when ensuring that the signal is OK (Lo level), it returns the XY stages 32X, 32Y to a previous exposure position of the shot domain $S_3$. Since stored beforehand by the interferometer at the point in time when the exposure is interrupted, the position can be reproduced at an extremely high precision. A term Tb of FIG. 11A is a time for returning the XY stages 32X, 32Y, Lo level of the signal BEAM RDY is confirmed again at the point in time $t_{93}$ when the XY stages come to a stop at the exposure position of the shot domain $S_3$, and the signal STEP. ST. is changed to Lo level (EXPOSURE). After that a similar operation to that of FIG. 6 follows, and an exposure of the shot domain $S_3$ ensues. Next, when stepping to the shot domain $S_4$, the XY stages will be placed in the exposure position determined during the term Ta as monitoring a measured value of the laser interferometer.

Figure 12:
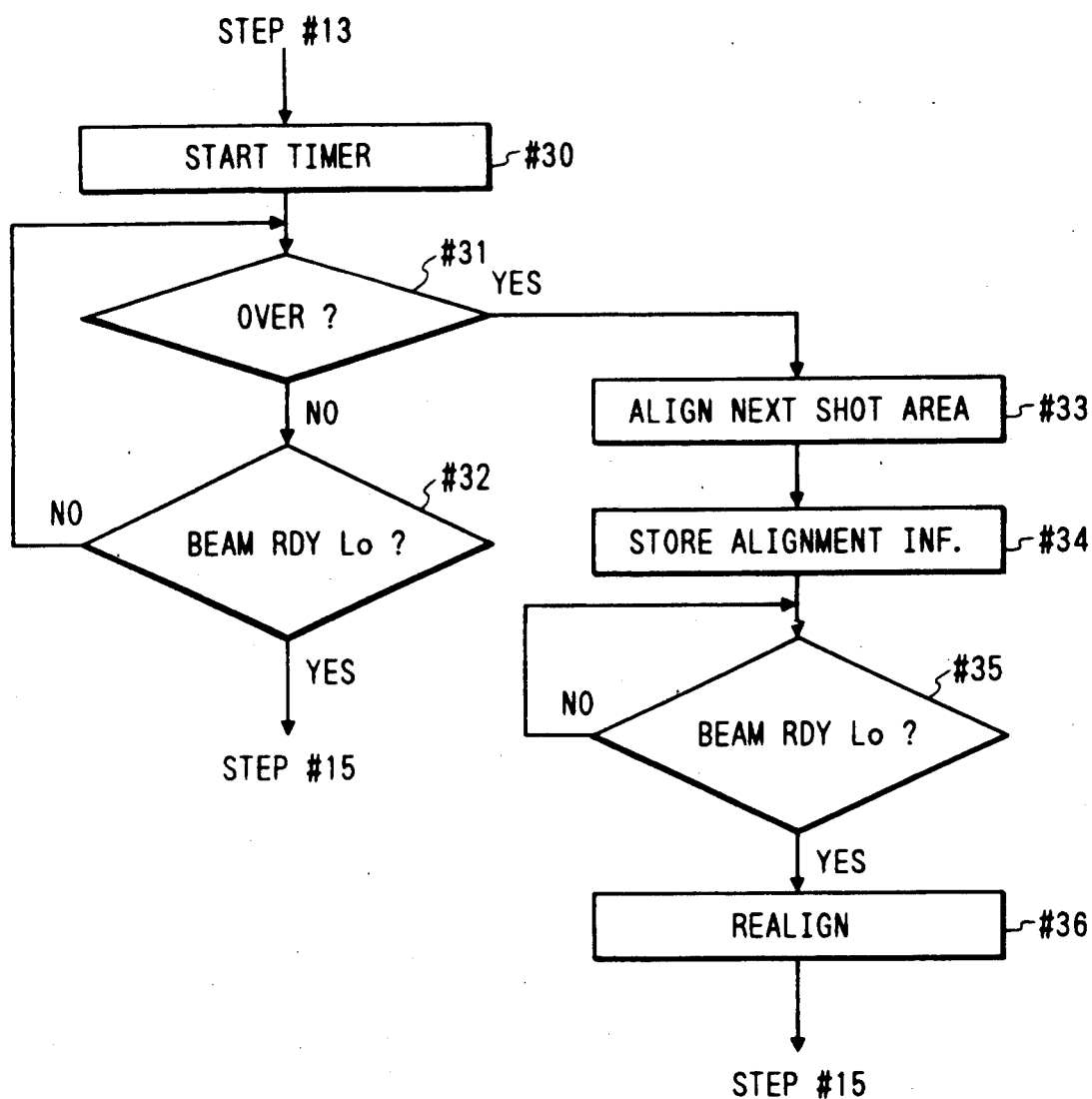
FIG. 12 is a flowchart indicating an operation of the third embodiment of the invention.

FIG. 12 is a flowchart indicating an operation of the third embodiment, wherein only a difference from FIG. 9 is shown. In the third embodiment, an internal timer is actuated in step #30 after step #13 of FIG. 9, whether or not the internal timer operates for timekeeping as predetermined is decided in step #31, and whether or not the signal BEAM RDY is Lo level is decided in step #32. Upon decision that the internal timer has operated for predetermined timekeeping in step #31, the process shifts to step #33. The operation coordinates with the aforementioned point in time $t_{90}$. In step #33 an alignment operation is carried out to the next shot domain, and information obtained through the alignment is stored in the internal memory in step #34. In step #35 whether or not the signal BEAM RDY is Lo is decided, and if BEAM RDY is Lo level, then an alignment to the shot domain halfway of the exposure is carried out in step #36, and the process shifts to step #15.

As described this embodiment is effective particularly in a die-by-die system (each shot alignment) wherein a mark of the shot domain is detected to alignment immediately before an exposure of each shot domain on the wafer. Then, the shot domain to which the alignment operation is started while the signal BEAM RDY is NG is not necessary limited to an adjacent one, and hence may be separated. Further the shot domain to align then may be plural in number.

Meanwhile, there known hitherto is an enhancement global alignment (EGA) method wherein a sampling alignment is carried out beforehand on some shot domains on the wafer, exposure positions of all the shot domains on the wafer are obtained through arithmetic operation by means of a statistical technique, and then an exposure is effected through simply through stepping the XY stages.

In case EGA method and operation of this embodiment are combined, with the shot domain $S_3$ interrupted for exposure as a shot domain to which an alignment operation is carried out at the term Ta in FIG. 11A, exposure positions (positions whereat the XY stages 32X, 32Y are stopped) calculated by EGA method and measured values of positions of the marks $MX_3$, $MY_3$ incidental to the shot domain $S_3$ are compared with each other, and thus whether or not a big error has arisen can be ensured. Further, with the alignment shot during the term Ta as a shot domain (one or more) not subjected to a sample alignment by EGA method, a precision can also be ensured.

In this embodiment, an arrangement is such that a timer is provided on the control system 12 or 40 and the time passing after the signal BEAM RDY becomes NG is counted thereby, however, the timer will be cleared at the point in time when the signal BEAM RDY becomes OK. When the count value becomes extremely large (for example, 60 seconds or over), an emergency signal will be outputted, thereby getting the laser light (or the stepper) down.

Further in this embodiment, a degree of abnormity arising on the beam quality is seized by the lapse of time of the signal BEAM RDY being NG, however, this may be done otherwise. For example, when the signal BEAM RDY becomes NG, information on variation of the absolute wavelength will be read into the control system 40 from the spectroscope 114 on the laser light source side. Then, means (hardware or software) for deciding whether a long time is required even from returning the beam quality at high speed since the variation is excessive, or whether the high-speed return is realized in a short time (for example, exposure time for one shot or stepping time) since the variation is little will be incorporated in the control system 40. Then, a sequence is arranged such that the operation not using the laser light such as alignment operation or the like will be started immediately after the signal SHUT. ST. becomes Lo level (CLOSED) after the signal BEAM RDY becomes NG, when the aforementioned decision means decides that a long time is required for the quality return. Thus, the wafer processing time can further be shortened. Or otherwise, an interface signal indicating a degree of the beam quality abnormity will be sent from the laser light source side to the stepper side.

Then, this embodiment refers to a case where an abnormity arises on the beam quality during exposure of one shot domain, however, the identical operation may also be realized in case an abnormity arises on the beam quality during stepping of step-and-repeat system.

Figure 13:
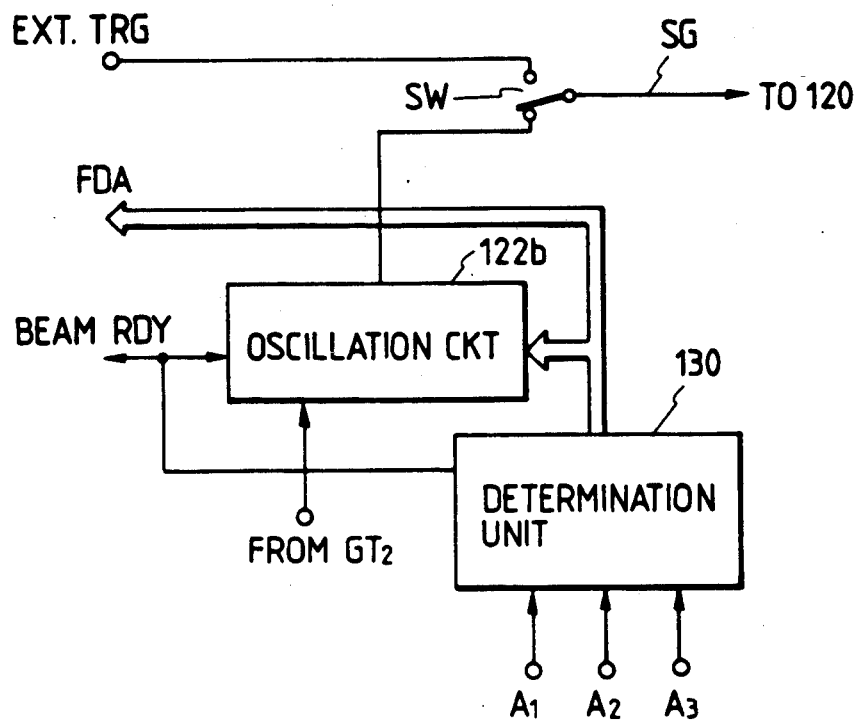
FIG. 13 is a block diagram representing a construction of a control system according to a fourth embodiment of the invention.

A fourth embodiment will be described next with reference to FIG. 13, however, this embodiment comprises developing an idea of the decision means described in the third embodiment. In FIG. 13, a determination unit 130 comprises the abnormal detecting circuit 123 for inputting information $A_1$ on a variation of the absolute wavelength, information $A_2$ on a variation of the spectrum width, and information $A_3$ on a pulse energy, creating signals corresponding to the signals $SS_1$, $SS_2$, $SS_3$ shown in FIG. 3 from the informations $A_1$, $A_2$, $A_3$ respectively, and changing the signal BEAM RDY to Hi level when any one of the signals comes outside the standard.

Further, the determination unit 130 outputs decision result information FDA according to kind and degree of the informations $A_1$, $A_2$, $A_3$ to an oscillation circuit 122b and the stepper side. The oscillation circuit 122b is capable of changing an oscillation frequency gradually or continuously between the minimum frequency and the maximum frequency according to the information FDA. For example, if the signal BEAM RDY becomes NG according to a decision result on the information $A_1$, then the determination unit 130 appreciates a released state of the servo locking for wavelength stabilization in, for example, three stages according to a degree of wavelength variation, and where the released state is taken severest, outputs the information FDA whereby the oscillation circuit 122b operates for self-oscillation at the maximum oscillation circuit (200 Hz). Similarly, where a released state of the servo locking is taken medium, the oscillation circuit 122b is controlled so as to have a frequency for the self-oscillation at a value (for example, 100 Hz or so) lower than the maximum oscillation frequency. Then, when a released state of the wavelength locking is taken slight, the oscillation circuit 122b is controlled so as to have a further low frequency (for example, 50 Hz or so).

Meanwhile, for decision on the information $A_3$ (amount of pulse energy), a difference between set value and measured value is obtained, how far the difference comes outside a width specified by the standard is appreciated, and a self-oscillation frequency of the oscillation circuit 122b is made variable according to the appreciation result. In case the beam quality becomes NG on both of the information $A_1$ and $A_3$, the highest frequency is selected from the appreciation results, which may be set on the oscillation circuit 122b.

Then, as for the information $A_2$ on spectrum width, since a spectrum width of the laser light is extremely narrow as 0.003 to 0.005 nm, a change in the spectrum width must be obtained through a sensor system capable of monitoring at such resolution (0.003 nm, for example). One factor to change the spectrum width comes in a deterioration of an optical element for narrowing bands (such as etalon, grating or the like). When narrowing bands by means of etalon, the spectrum width may change according to a defective gap of etalon.

Figure 14:
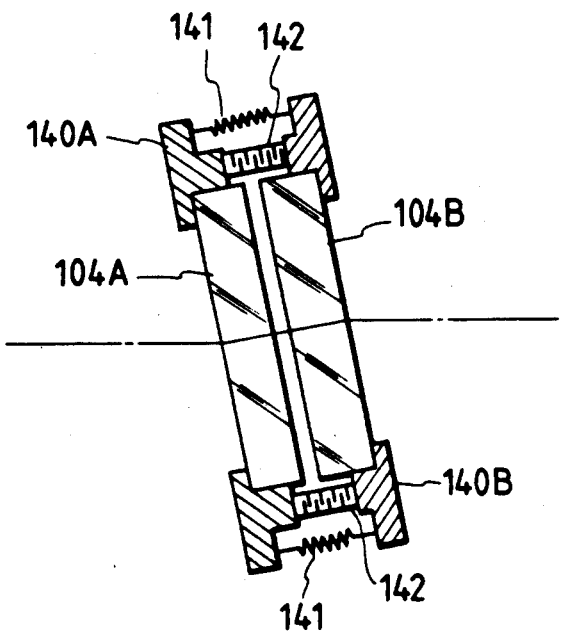
FIG. 14 is a sectional view representing typically a structure of a gap adjusting mechanism of etalon.

Now, therefore, as shown in FIG. 14, a gap adjusting mechanism consisting of a tension spring 141, a piezo-element 142 and others is provided at a plural portion around between hardwares 140A, 140B retaining each of two quartz plates (with a transmissive reflection film) 104A, 104B constructing the etalon, and the piezo-element 142 is properly driven to adjust fine a gap and a parallelism of the two quartz plates 104A, 104B. Then, the laser light source is operated for dummy oscillation, and thus as monitoring a change in the spectrum width on a high resolution of spectrum width sensor provided within the spectroscope 114, the piezo-element 142 is driven minutely to narrow the spectrum width most. In this case, a multiplicity of pulses must be emitted for returning the spectrum width as it was, therefore a frequency of the trigger signal SG from the oscillation circuit will preferably be high to work.

Consequently, the determination unit 130 may change an oscillation frequency of the oscillation circuit 122 according to the information $A_2$ (variation of the spectrum width), however, practically when a spectrum width change at a specified value or over is detected, the oscillation frequency will preferably be set to maximum, thereby quickening a drive of the piezo-element 142.

In this embodiment, since a self-oscillation frequency of the laser light source is changed between the minimum oscillation frequency (1 Hz, for example) and the maximum oscillation frequency (200 Hz, for example) according to a factor of having caused a beam quality abnormity or a degree of the abnormity, an advantage is such that the beam quality may be returned in a shorter period of time.

Each embodiment of this invention has been described as above, and from using the signal BEAM RDY common in each embodiment pertinently, a frequency of the trigger signal in self-oscillation can be set relatively free unless it exceeds the upper bound (200 Hz, for example). In an extreme case, the trigger signal may be one pulse which cannot be defined as frequency.

To check whether or not the signal BEAM RDY is NG, for example, 1-pulse trigger signal is sent to the high pressure discharge circuit 120 to self-oscillation from the oscillation circuit 122, a degree of the beam quality abnormity (deviation from the standard) is detected on the spectroscope 114, and thus an angle of inclination of the etalon 104 will be changed to a return operation through open control according to the result obtained as above. In this case, since the return operation is effected through open control, a dummy emission will be made simply in one pulse in principle, however, a further one-pulse emission is carried out after completion of the open control practically, thereby ensuring that the beam quality is returned as it was (the signal BEAM RDY being OK). An interval between the first pulse and the second pulse must be made then longer than a response time of the open control system for returning the beam quality. Accordingly, the interval (time) between the first pulse and the second pulse will not be defined as an inverse number (period) of a predetermined frequency.

Then, in the case of minimum oscillation frequency for stabilizing the beam quality within the standard, the pulse (trigger) interval is not necessarily limited to a definite case only. For example, in case the beam quality can be returned on one-pulse emission according to the open control, if the beam quality becomes OK on the second pulse emission for confirmation, then the time for the next emission can also be adjusted to several seconds or longer.

Another construction is such that the oscillation circuit for self-oscillation is provided in two, the one oscillation circuit is made to oscillate a first trigger signal (pulse 2 seconds in interval) of an extremely low frequency (0.5 Hz, for example) which is almost minimal for the wavelength servo-lock to work for keeping the beam quality, and the other oscillation circuit outputs a second trigger signal consisting of one pulse or continuous plural pulse before the next pulse of the first trigger signal when the signal BEAM RDY becomes NG according to an emission on one pulse of the first trigger signal. Then a logical sum (OR) of the first trigger signal and the second trigger signal may be taken to work as a trigger signal of the high pressure discharge circuit 120.

Then, in each embodiment described above, an arrangement is such that the stand-by dummy oscillation for which the stepper side has no access to the laser light source is all effected by the oscillation circuit 122 on the laser light source side, however, an equivalent function to the oscillation circuit 122 may be provided on the stepper side, thereby operating the laser light source for self-oscillation on the signal EXT. TRG.

Further the shutter SH provided on the laser light source side may be provided within the stepper body otherwise, but in extreme case, it may also be dispose retractably between the projection lens PL and the wafer W. Still further, when the signal BEAM RDY becomes NG while the stepper operates for exposure, the wafer may be shunted outside a field of view of the projection lens PL (outside an optical path of the laser light) by shifting the XY stages 32X, 32Y instead of closing the shutter SH. In this case, a pattern image of the reticle R will be projected onto a portion other than the wafer on the XY stages 32X, 32Y, therefore a photoelectric sensor for receiving the pattern image entirely may be fixed on such portion, thereby checking a pulse energy during the self-oscillation at an imaging position of the projection lens PL.

According to this invention described as above, in case a beam quality of the laser light gets abnormal, the quality can be returned within the original standard without getting the laser light source down.

Then, when the laser light source is operated for self-oscillation while the laser light is not used on the working apparatus side, not only the pulse number for oscillation can be minimized but also the beam quality can be returned quickly against an abnormity arising on the beam quality. Generally a gas life in such kind of pulse laser light source and a lifetime of optical and electric parts are determined on the pulse number, therefore the pulse number conductive to a practical working (exposure) can be increased relatively.

Further, when the laser light source detects an abnormity on the beam quality to operate for return, an operation not using the laser light may be carried out partly in antecedence on the working apparatus side, therefore a deterioration of operating ratio and throughput can be minimized as a whole.

What is claimed is:

1. In a laser processor provided with a pulse oscillating laser light source, excitation means for exciting said laser light source in response to a trigger signal for pulse oscillation, beam quality adjusting means for adjusting a beam quality of a laser light within a preset standard as monitoring the pulse-oscillated laser light at least partly, a working apparatus for exposing or processing a workpiece by projecting the adjusted laser light thereon, the improvement comprising:

- a screening member for cutting off an optical path of said laser light to the workpiece when said working apparatus interrupts an operation using said laser light for a predetermined period of time or over;
- trigger control means for impressing said trigger signal on said excitation means in a low frequency band necessary for said beam quality adjusting means to stabilize a beam quality of said laser light while the screening member cuts off the optical path;
- abnormal detecting means for generating a quality abnormal signal when detecting a beam quality of said laser light coming under a standard necessary for said exposure or processing;
- correction means for keeping a cut-off operation of said screening member when the quality abnormal signal is generated, and correcting a frequency band of the trigger signal to be impressed on said excitation means to the low frequency band set by said trigger control means or over.

2. In a laser processor provided with a pulse oscillating laser light source, excitation means for exciting said laser light source in response to a trigger signal for pulse oscillation, beam quality adjusting means for adjusting a beam quality of a laser light within a preset standard as monitoring the pulse-oscillated laser light at least partly, a working apparatus for exposing or processing a workpiece by projecting the adjusted laser light thereon, the improvement comprising:

- trigger signal generating means capable of impressing said trigger signal on said excitation means at an arbitrary frequency between a maximum oscillation frequency of said laser light source to be required during processing of said working apparatus and a minimum oscillation frequency necessary at the least for said beam quality adjusting means to stabilize a beam quality of said laser light;
- abnormal detecting means for generating a quality abnormal signal when detecting a beam quality of said laser light coming under a standard necessary for said exposure or processing;
- stop means for stopping an optical path of said laser light from reaching said workpiece, when said working apparatus interrupts an operation using said laser light for a predetermined period of time or over, or when said quality abnormal signal is generated;
- control means for controlling said trigger signal generating means so that a frequency of said trigger signal is set to said minimum oscillation frequency or thereabout during the period of time other than that in which the stop means is operating and said quality abnormal signal is generated, and that the frequency of said trigger signal is set to come between said minimum oscillation frequency and maximum oscillation frequency according to a degree of quality abnormity when said quality abnormal signal is generated.

* * * * *